United States Patent
Kimura

Patent Number: 5,786,689
Date of Patent: Jul. 28, 1998

[54] APPARATUS INCLUDING A MEASUREMENT TIME COUNTING DEVICE FOR MEASURING AN ELECTRICAL CHARACTERISTIC OF SEMICONDUCTOR

[75] Inventor: Mikihiro Kimura, Itami, Japan

[73] Assignee: Mitsubishi Denki Kabushiki Kaisha, Tokyo, Japan

[21] Appl. No.: 530,089

[22] Filed: Sep. 19, 1995

[30] Foreign Application Priority Data

Sep. 20, 1994 [JP] Japan .................. 6-225171

[51] Int. Cl.$^6$ .................................. G01R 31/26
[52] U.S. Cl. ........................ 324/158.1; 324/765
[58] Field of Search ................. 324/158.1, 760, 324/765, 766, 767

[56] References Cited

U.S. PATENT DOCUMENTS

| | | | |
|---|---|---|---|
| 5,349,290 | 9/1994 | Yamada | 324/158.1 |
| 5,519,327 | 5/1996 | Consiglio | 324/678 |
| 5,600,578 | 2/1997 | Fang et al. | 364/578 |

OTHER PUBLICATIONS

Keithley, "Test & Measurement 1993–1994 Catalogue and Reference Guide"; pp. 80–85. (Month Unavailable).

Hewlett Packard, "Semiconductor Parameter Analyzer" and Precision Semiconductor Parameter Analyzer; Technical Data, pp. 1–9, Oct. 1993. (English Translation attached).

*Primary Examiner*—Vinh P. Nguyen
*Assistant Examiner*—Russell M. Kobert
*Attorney, Agent, or Firm*—Leydig, Voit & Mayer, Ltd.

[57] ABSTRACT

An apparatus for measuring an electrical characteristic of a semiconductor device, particularly for determining the dependence of leakage current of the semiconductor device with time or after a stress is applied to the semiconductor device. An accumulator counts pulses of an internal clock thereby separately determining the time during which a stress is applied and the time during which a measurement is made. These two times are recorded with the measured characteristic, such as leakage current. The measured characteristic is plotted on the basis of the duration of the applied stress and duration of the measurement and displayed.

8 Claims, 9 Drawing Sheets

| MEASUREMENT VALUE | STRESS APPLIED TIME ($T_{st}$) | MEASUREMENT TIME ($T_m$) |
|---|---|---|
| | | |
| | | |
| | | |

$V_{jst} > V_{jm1} > V_{jm2}$

| MEASUREMENT VALUE | MEASUREMENT TIME |
|---|---|
|  |  |
|  |  |
|  |  |

5,786,689

APPARATUS INCLUDING A MEASUREMENT TIME COUNTING DEVICE FOR MEASURING AN ELECTRICAL CHARACTERISTIC OF SEMICONDUCTOR

BACKGROUND OF THE INVENTION

1. Field of the Invention

The present invention relates to an apparatus for measuring an electrical characteristic of a semiconductor device (which will be referred to hereinafter to as a semiconductor electrical characteristic measuring apparatus).

2. Description of the Related Art

FIG. 10 is an illustration of a general arrangement of a system including this kind of semiconductor electrical characteristic measuring apparatus. In the illustration, designated at 100 is a source measuring unit system, denoted at 200 is a test fixture, and depicted at 300 is a host computer.

The source measuring unit system 100, in addition to a power unit and measuring unit for measurement of electrical characteristics, has a microcontroller for controlling these units to carry out the measurement and a local memory for storing data obtained through the measurement. This source measuring unit system 100 carries out a measurement under control of the microcontroller responsive to a command from the host computer 300, and stores the measured data in the local memory. The host computer 300, for example, displays the measured data if required.

To the source measuring unit system 100 there is coupled the test fixture 200 which holds a sample, i.e., a semiconductor device, being measured. This invention relates particularly to a section of the source measuring unit system 100.

FIG. 11 is an illustration of an arrangement of a known semiconductor electrical characteristic measuring apparatus. In FIG. 11, numeral 100 indicates a semiconductor electrical characteristic measuring apparatus (corresponding to the source measuring unit system shown in FIG. 10), which includes a source measuring unit (which will be referred hereinafter to as an SMU) 1 making up a power unit and measuring unit, a control section 2 comprising a microcomputer or the like and taking charge of the control of the whole system including the operation of the SMU 1, a ROM 3a storing a control program for the operation of the control section 2, and a RAM 4a storing various kinds of measured data.

Also included therein are a keyboard 5 for receiving inputs, a display section 6 for displaying the measurement results and others, an analog/digital converter (which will be referred hereinafter to as an A/D converter) 7 for mutual conversion between the analog signal in the SMU 1 and the digital signal in the control section 2, and a timer 8. Numeral 9 stands for a semiconductor device being a sample to be measured.

Moreover, the SMU 1 is equipped with a voltage source 1a, a current source 1b, an ammeter 1c, a voltmeter 1d, and a change-over switch 1e. When the change-over switch 1e is connected to the voltage source 1a side as illustrated, a voltage from the voltage source 1a is applied so that a current is measured by the ammeter 1c. On the other hand, when the change-over switch 1e is connected to the current source 1b side, a current from the current source 1b is supplied so that a voltage is measured by the voltmeter 1d.

Although a single SMU 1 is shown in FIG. 11, in fact the semiconductor electrical characteristic measuring apparatus can include a number of SMUs 1 which are under control of the control section 2.

In operation, the measurement of the electrical characteristic of the sample 9 being measured is done in accordance with the control program of the ROM 3a under control of the control section 2. A description will be made in terms of, for example, a measurement of a change of a leakage current relative to the stress applying time when a stress voltage is applied to the sample 9 being measured.

First, the change-over switch 1e is connected to the voltage source 1a side and a predetermined stress voltage from the voltage source 1a is applied to the sample 9 being measured. Further, the ammeter 1c measures the leak current at a predetermined time interval, the measurement results being stored in the RAM 4a. In the RAM 4a, the leakage current is stored as the measurement value, for example, as shown in FIG. 12 and the time of the measurement is also recorded. After the completion of the measurement, the change of the leakage current with respect to the stress applying time is, if required, displayed in the display section 6 as a characteristic curve of the leakage current relative to the stress applying time on the basis of the measured values and the measurement times.

The known semiconductor electrical characteristic measuring apparatus is constructed as described above, while not separately taking the stress applying time Tst and measurement time Tm in consideration. For this reason, in cases where, for example, the measurement of the leakage current is performed after the application of the stress voltage for a predetermined time period as described above, the change of the leakage current I relative to the real stress applying time Tst plus the measurement time Tm, but not the change of the leakage current I with respect to the real stress applying time Tst, is plotted and recorded as shown in FIG. 13 and displayed in the display section 6, thus generating errors.

Particularly, since the measurement time period recently tends to be shortened in reliability evaluation of such semiconductor devices, the addition of the measurement time Tm makes the error large.

In addition, since in the known semiconductor electrical characteristic measuring apparatus a single power supply acts as both the stress voltage applying power supply and measurement power supply, if the stress voltage is different from the measurement voltage, the voltage of the power supply needs to be frequently switched, which makes the measurement time longer and increases the magnitude of the foregoing error. This also provides a problem in that the control by the control section becomes more complicated.

There have been the above-mentioned problems which arise with the known semiconductor electrical characteristic measuring apparatus.

SUMMARY OF THE INVENTION

The present invention has been developed in order to eliminate the foregoing problems, and it is therefore an object of this invention to provide an electrical characteristic measuring apparatus for a semiconductor device which is capable of more accurately obtaining the time dependency of the electrical characteristic in measurement of the electrical characteristic of the semiconductor device.

According to a first aspect of this invention, there is provided an apparatus for measuring an electrical characteristic of a semiconductor device which comprises stress applying/measuring means for applying an electrical stress to a sample being measured and for measuring a current and voltage generated in the sample being measured, time measuring means for obtaining a time of the stress application by the stress applying/measuring means and a time taken for the measurement, separately, memory means for recording a measurement value obtained by the stress applying/measuring means and at least the stress applied time obtained by the time measuring means, display means for displaying the measurement results on the basis of the record in said memory means, and control means for controlling the above-mentioned means to carry out the measurement of the electrical characteristic of the semiconductor device.

In addition, according to a second aspect of this invention, the stress applying/measuring means is equipped with a stress power unit for applying the electrical stress to the sample being measured, a second source measuring unit for measuring one of a current and voltage generated in a state in which one of a given voltage and current is applied to the sample being measured when the sample is in measurement, and a stress/measurement change-over switch for switching the stress power unit and the second source measuring unit selectively to connect one of them to the sample being measured.

In the foregoing first aspect of this invention, the time measuring means separately and accurately obtains the stress applied time and the measurement time (at least the stress applied time), thus more accurately obtaining the transition of the measurement value relative to the stress applied time.

Furthermore, in the foregoing second aspect of this invention, the stress power unit for applying the electrical stress to the sample being measured and the second source measuring unit for measuring the current or voltage generated in a state where a given voltage or current is applied to the sample being measured at the time of the measurement are selectively switched by the stress/measurement change-over switch so as to be connected to the sample being measured.

The above and other objects, features, and advantages of the Invention will become more apparent from the following description when taken in conjunction with the accompanying drawings.

DETAILED DESCRIPTION OF THE PREFERRED EMBODIMENTS

A description will be made hereinbelow with reference to the drawings in terms of embodiments of the present invention.

First Embodiment

Figures 1, 2:
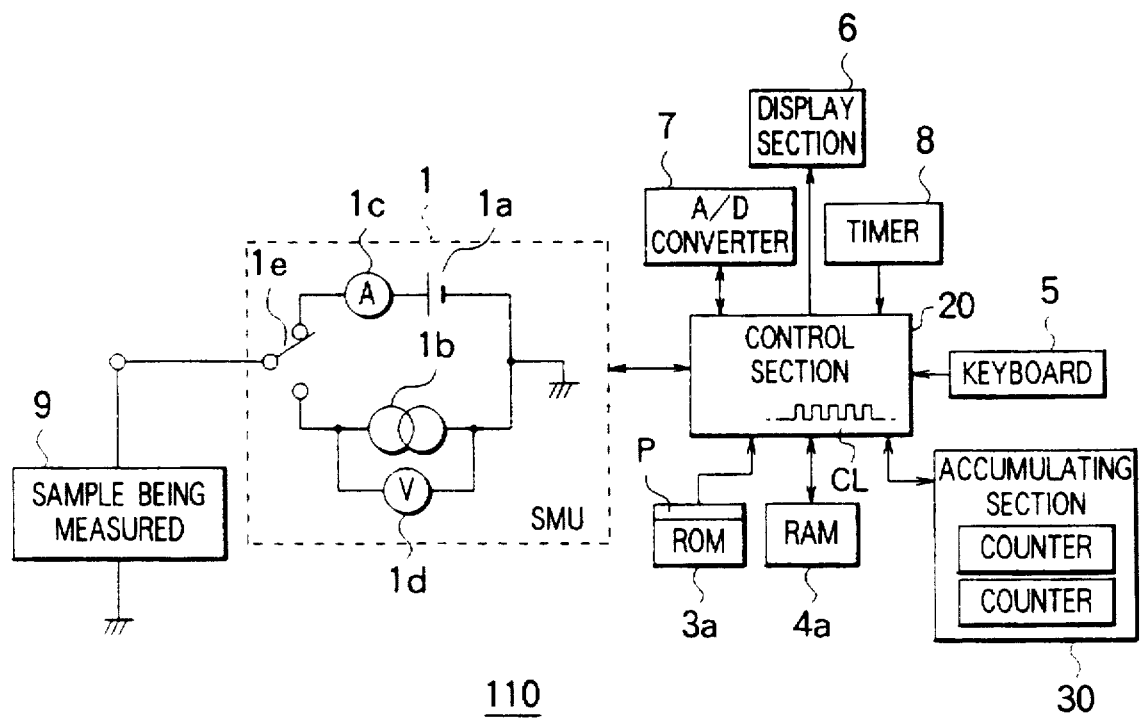
FIG. 1 is an illustration of an arrangement of a semiconductor electrical characteristic measuring apparatus according to an embodiment of this invention.
FIG. 2 is an illustration of one example of recorded contents in a RAM shown in FIG. 1.

FIG. 1 illustrates an arrangement of a semiconductor electrical characteristic measuring apparatus according to an embodiment of this invention. In the illustration, designated at numeral 110 is a semiconductor electrical characteristic measuring apparatus, which includes a source measuring unit (SMU) 1 for making up a power unit and a measuring unit, a control section 20 comprising a microcomputer or the like to perform the control of the entire apparatus including the operation the SMU 1, a ROM 3a for storing a control program taking charge of the operation of the control section 20, and a RAM 4a for storing various kinds of measurement data.

Also included therein are a keyboard 5 for input, a display section 6 for displaying the measurement results and others, an analog/digital converter (A/D converter) 7 for carrying out the mutual conversion between an analog signal in the SMU 1 and a digital signal in the control section 20, and a timer 8. In addition, the apparatus is equipped with an accumulating (integrating) section 30 for counting, for example, internal clocks of the control section 20 to accumulate the count values to obtain the real stress applied time Tst and measurement time Tm, respectively, the accumulating section 30 being composed of, for example, two counters for the real stress applied time Tst and measurement time Tm. Numeral 9 denotes a semiconductor device, i.e., a sample being measured.

The SMU 1 has a voltage source 1a, a current source 1b, an ammeter 1c, a voltmeter 1d, and a change-over switch 1e. When the change-over switch 1e is connected to the voltage source 1a side as illustrated, the ammeter 1c measures a current in a state in which a voltage from the voltage source 1a is applied thereto. On the other hand, when the change-over switch 1e is connected to the current source 1b side, the voltmeter 1d measures a voltage in a state in which a current from the current source 1b is supplied thereto.

As well as the known apparatus, a number of SMUs 1 are provided in this apparatus and integrally controlled by the control section 20.

In this embodiment, the SMU 1 (first source measuring unit) constitutes a stress applying/measuring means, the accumulating section 30 makes up a time measuring means, the RAM 4a composes a memory means, the display section 6 acts as a display means, and the control section 20, ROM 3a, keyboard 5, A/D converter 7 and timer 8 form a control means.

In operation, the measurement of the electrical characteristic of the sample 9 being measured is made in accordance with the control program in the ROM 3a under control of the control section 20. Like the known apparatus, a description will be made in terms of, for example, the measurement of the change of the leakage current relative to the stress applied time when a stress voltage is applied to the sample 9 being measured.

First, the change-over switch 1e is connected to the voltage source 1a side and a predetermined stress voltage is given from the voltage source 1a to the sample 9 being measured. In this state, the ammeter 1c measures the leakage current at a given time interval based on the time from the timer 8, the measured leakage currents being stored in the RAM 4a. For example, in the RAM 4a the leakage currents are recorded as the measurement values as shown in FIG. 2. Simultaneously with this operation, the control section 20 operates the accumulating section 30 to count the internal clock CL during the stress application and during the measurement, thereby obtaining the real stress applied time Tst and the measurement time Tm. These times are also recorded in the RAM 4a in connection with the respective measurement values. For obtaining the stress applied time Tst, the counting stops for the measurement time period.

Figure 3:
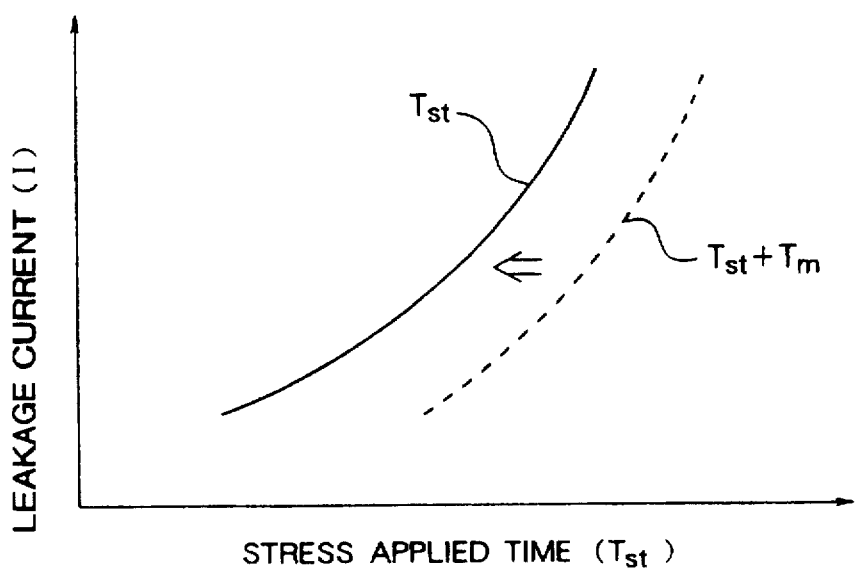
FIG. 3 is an illustration of measurement results obtained and plotted by the FIG. 1 apparatus.

For this reason, in a case where, after the completion of the measurement, the transition of the leak current I of a semiconductor device with the passage of time is displayed on the display section 6, as plotted in FIG. 3 the display can show the change of the leakage current I of the semiconductor device with respect to the real stress applied time Tst. Accordingly, an accurate dependency of the semiconductor device leakage current on the stress applied time Tst is obtainable.

Although the accumulating section 30 is disclosed as a hardware element to gain the real stress applied time Tst and measurement time Tm, the same effect can be accomplished even if a counter is embodied in software, e.g., constructed with a program P in the control section 20 to obtain the stress applied time Tst and measurement time Tm.

Further, although in the above-described embodiment the stress applied time Tst and the measurement time Tm are obtained, it is also possible to obtain only the stress applied time Tst.

Moreover, although in the above description the measurement of the current is made when the voltage is applied, the same effect can be achieved even if the change-over switch 1e of the SMU 1 is switched so that the voltmeter 1d measures the voltage developed when current is supplied from the current source 1b.

As described above, in this embodiment the accumulating section 30 is provided to obtain the real stress applied time Tst and the measurement time Tm so that the real stress applied time Tst and the measurement time Tm are accurately and individually obtainable, thus more accurately obtaining the time dependence of the leakage current relative to the stress applied time as compared with the prior apparatus.

Second Embodiment

Figure 4:
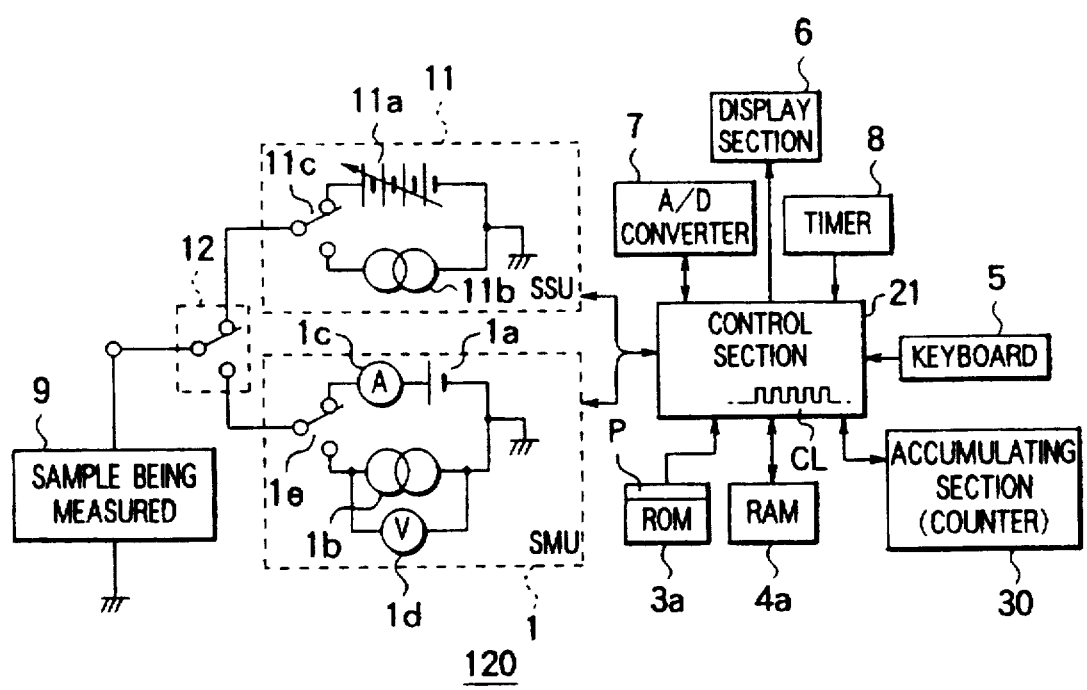
FIG. 4 is an illustration of an arrangement of a semiconductor electrical characteristic measuring apparatus according to another embodiment of this invention.

FIG. 4 is an illustration of an arrangement of a semiconductor electrical characteristic measuring apparatus according to another embodiment of this invention. The difference between the FIG. 4 semiconductor electrical characteristic measuring apparatus designated at numeral 120 and the semiconductor electrical characteristic measuring apparatus according to the first embodiment is to place a dedicated stress power unit 11 (which will be referred hereinafter to as an SSU) for applying a stress voltage or stress current to a sample 9 being measured and a stress/measurement change-over switch 12 for carrying out the switching operation between the SSU 11 and an SMU 1 being a second source measuring unit to connect one of them to the sample 9 being measured.

In this embodiment, the control section is designated at numeral 21 because the operation at measurement is different from that in the first embodiment. Accordingly, the contents of the control program stored in the ROM 3a differ from that in the first embodiment.

The SSU 11 contains a variable voltage type stress voltage source 11a, a stress current source 11b, a change-over switch 1c for switching therebetween.

The actual apparatus has a number of sections each comprising the SMU 1, SSU 11 and stress/measurement change-over switch 12, the number of sections being integrally controlled by the control section 21.

In operation, as in the first embodiment, a description will be made in terms of the measurement of the change of the leakage current relative to the stress applied time when a stress voltage is applied to the sample 9 being measured.

In this embodiment, the apparatus 120 can apply the stress voltage and the applying voltage for measurement separately to the sample 9 being measured. Accordingly, even if the stress voltage Vst and the measurement applying voltage Vm are different from each other, with only the switching between the SSU 11 and SMU 1 being made through the stress/measurement change-over switch 12, and accurate measurement can quickly and easily be accomplished.

First, the stress/measurement change-over switch 12 is coupled to the SSU 11 side as illustrated. The change-over switch 11c of the SSU 11 is switched to the stress voltage source 11a side as illustrated, whereby the stress voltage Vst from the stress voltage source 11a is applied to the sample 9 being measured.

When the timer 8 shows that a predetermined time has elapsed, the change-over switch 12 is switched to the SMU 1 side. The change-over switch 1e of the SMU 1 takes the voltage source 1a side position. Thus, the leakage current I in the sample 9 is measured by the ammeter 1c in a state in which the measurement applying voltage Vm1 from the voltage source 1a is applied thereto, and stored in the RAM 4a. As in the first embodiment, in the RAM 4a the leakage currents are recorded as the measurement values as shown in FIG. 2, and the stress applied time Tst and measurement time Tm counted in the accumulating section 30 are respectively recorded in connection with the measurement values.

Subsequently, the change-over switch 12 is switched to the SSU 11 side so that the stress voltage Vst is again applied from the stress voltage source 11a thereto. Further, after a predetermined time elapses, the change-over switch 12 is switched to the SMU 1 side, and the ammeter 1c measures the leakage current in the sample 9 being measured under the measurement applying voltage Vm1, before the leakage current, i.e., the measurement value, the stress applied time Tst and the measurement time Tm are recorded in the RAM 4a.

This operation is repeatedly done, thereby obtaining the time change of the leakage current relative to the stress applied time in the case that the stress voltage Vst and the measurement applying voltage Vm are different from each other.

Figure 5:
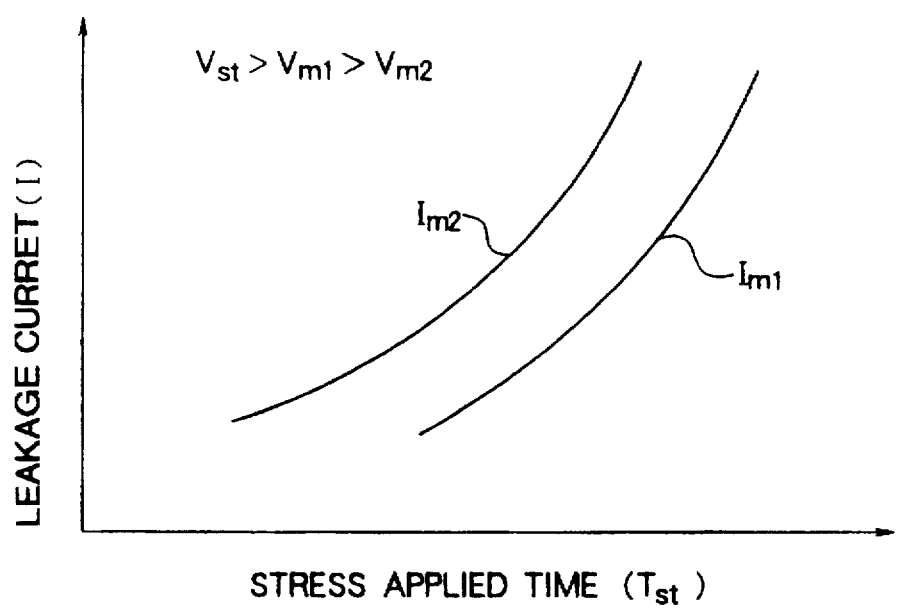
FIG. 5 is an illustration of measurement results obtained and plotted by the FIG. 4 apparatus.

In addition, by changing the measurement applying voltage Vm, as plotted in FIG. 5, for example, the change in the leakage current Im1 relative to the stress applied time due to the measurement applying voltage Vm1 and the transition of the leakage current Im2 relative to the stress applied time Tst due to the measurement applying voltage Vm2 are obtained and displayed in the display section 6. This provides more detailed, more accurate results.

Figure 6:
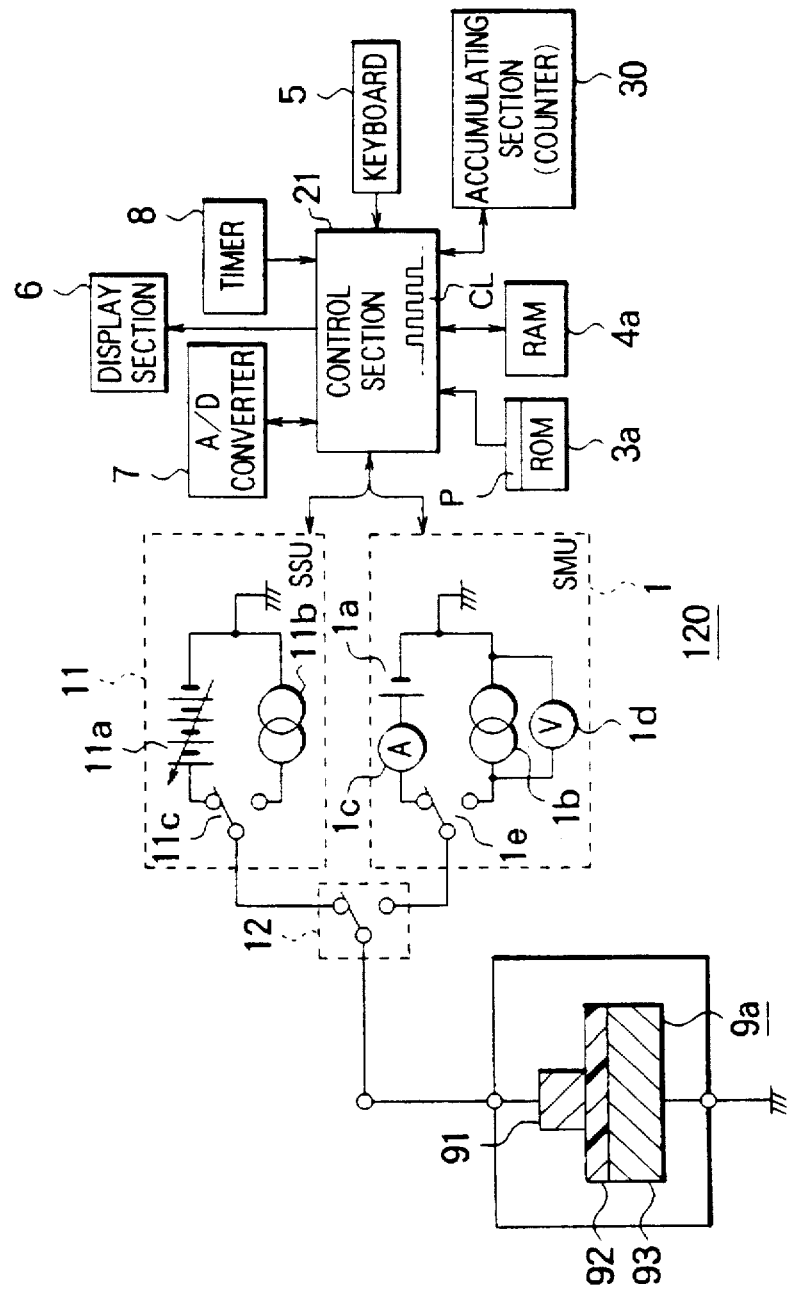
FIG. 6 shows an arrangement taken for measuring a dielectric film leakage current in a dielectric film in the FIG. 4 apparatus.

On the other hand, FIG. 6 shows an arrangement in the case that the FIG. 4 apparatus 120 measures the leakage current in a dielectric film of a semiconductor device. Reference numeral 9a represents a sample being measured, where 91 designates a gate electrode, 92 denotes an insulating film serving as a dielectric film, and 93 depicts a semiconductor substrate. A stress voltage is applied between the gate electrode 91 and the semiconductor substrate 93 so as to measure the change of of a dielectric film leakage current Iox relative to the stress applied time in the insulating film 92.

Figure 7:
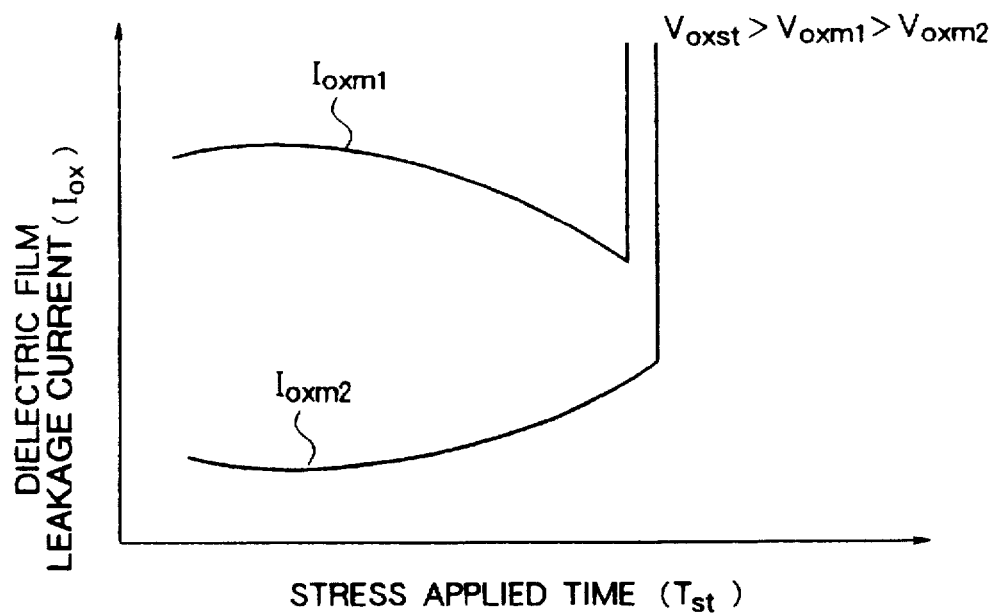
FIG. 7 is an illustration of measurement results obtained and plotted by the FIG. 6 apparatus.

FIG. 7 is a plotted illustration, displayed in the display section 6, of the transition of a dielectric film leakage current Ioxm1 relative to the stress applied time Tst due to a measurement applying voltage Voxm1 and the transition of a dielectric film leakage current Ioxm2 relative to the stress applied time Tst due to a measurement applying voltage Voxm2 in a state with application of a stress voltage Voxst. From this plotted illustration, it is possible to more accurately obtain the change of the dielectric film leakage current Iox with respect to the stress applied time Tst in more detail.

Figure 8:
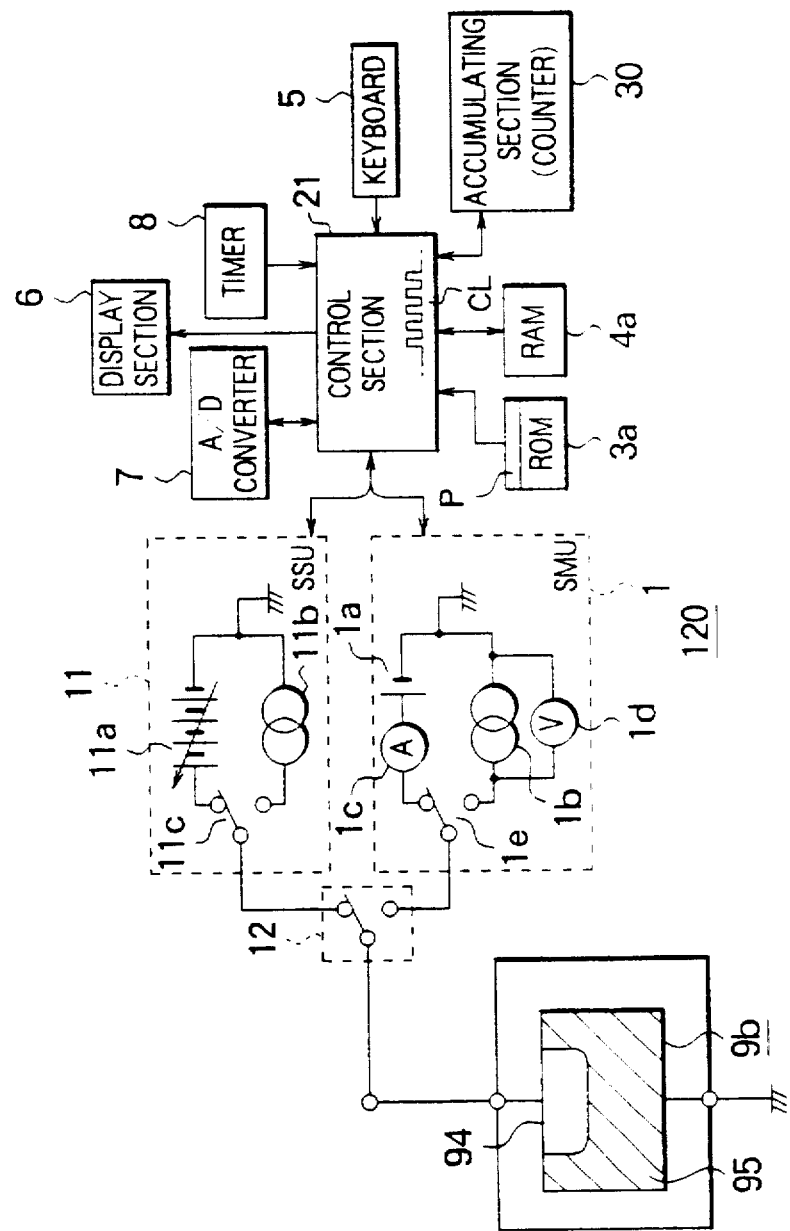
FIG. 8 shows an arrangement taken for measuring a junction leakage current in a PN junction section of a semiconductor device in the FIG. 4 apparatus.

Furthermore, FIG. 8 shows an arrangement in the case that the FIG. 4 apparatus 120 measures the leakage current in a PN junction section of a semiconductor device. Reference numeral 9b designates a sample being measured, in which numeral 94 represents an N type area and 95 indicates a P type semiconductor substrate. A stress voltage is applied to between the N type area 94 and the P type semiconductor substrate 95 so as to measure the change of a junction leak current Ij relative to the stress applied time Tst in the junction section.

Figure 9:
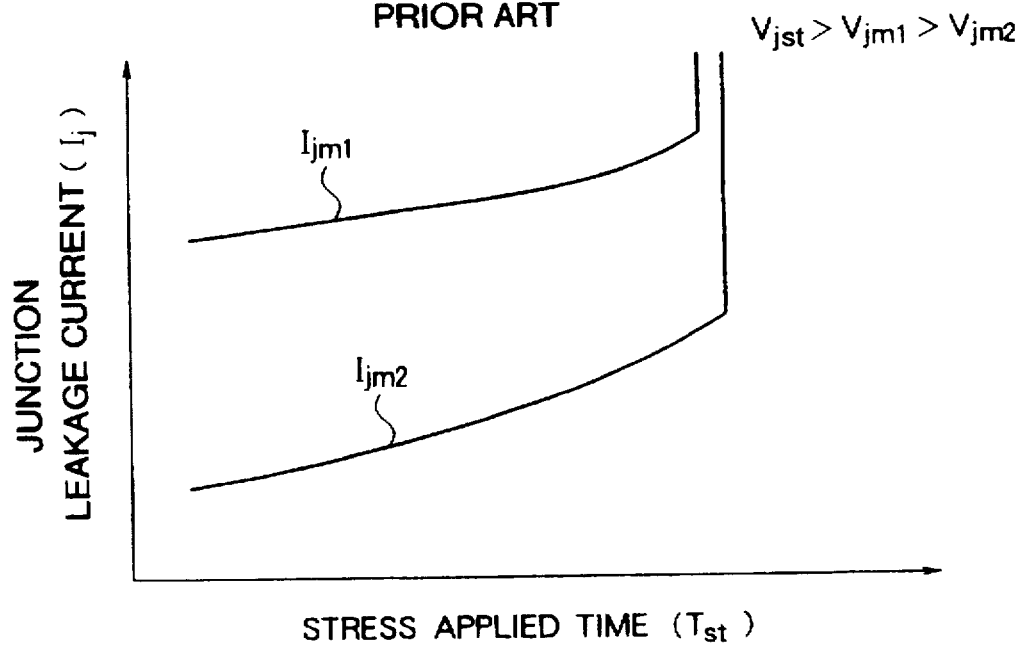
FIG. 9 is an illustration of measurement results obtained and plotted by the FIG. 8 apparatus.
Figure 10:
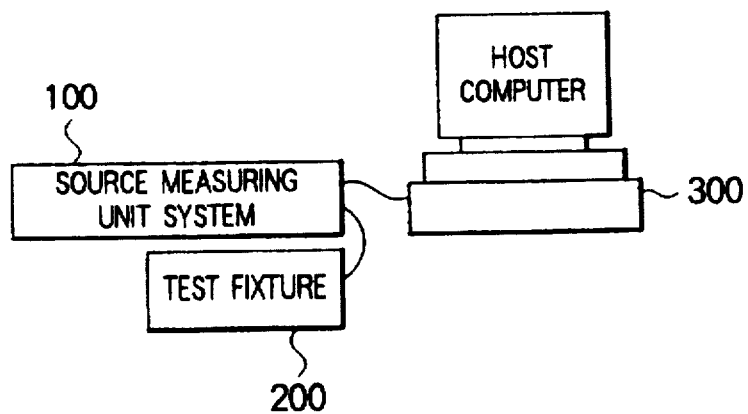
FIG. 10 is an illustration of a general arrangement of a system including such a semiconductor electrical characteristic measuring apparatus.
Figures 11, 12:
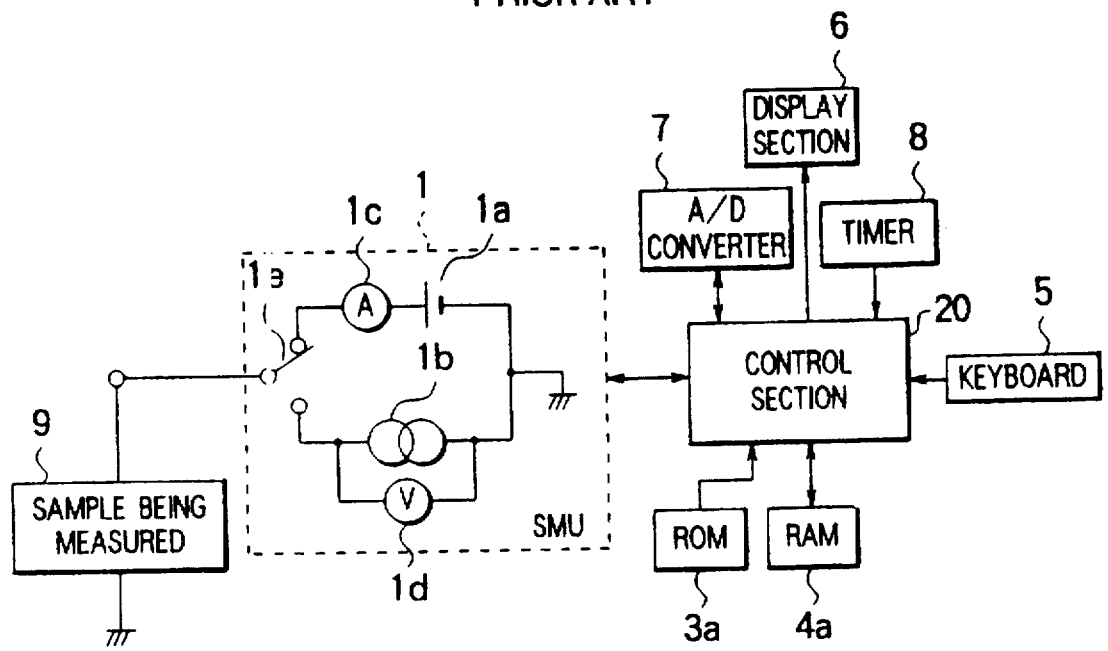
FIG. 11 illustrates an arrangement of a privately known but unpublished semiconductor electrical characteristic measuring apparatus.
FIG. 12 is an illustration of recorded contents in a RAM shown in FIG. 11.
Figure 13:
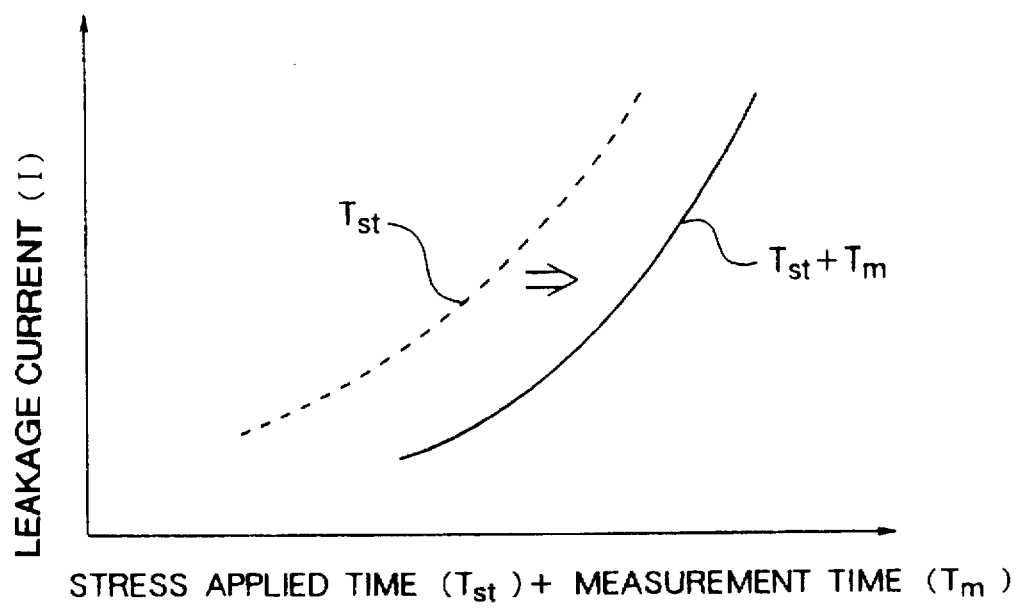
FIG. 13 is an illustration of measurement results obtained and plotted by the FIG. 11 apparatus.

FIG. 9 is a plotted illustration, displayed in the display section 6, of the change of a junction leakage current Ijm1 relative to the stress applied time Tst due to a measurement applying voltage Vjm1 and the change of a junction leakage current Ijm2 relative to the stress applied time Tst due to a measurement applying voltage Vjm2 which take place in response to application of a stress voltage Vjst. Thus, the change of the junction leakage current Ij with respect to the stress applied time Tst is more accurately obtainable in more detail.

Even in this embodiment the counter to obtain the stress applied time Tst and the measurement time Tm can also be constructed with a program set in the control section 21. In addition, even if only the stress applied time Tst is obtained, it is also possible to measure accurately the change of the leakage current relative to the stress applied time Tst. Moreover, although in the above description the measurement of the current is made in a state where the voltage is applied as the stress, the same effect can be obtained even if a current is supplied as the stress to measure the current or the voltage.

As described above, in this embodiment, particularly the SSU 11 for applying the stress voltage or stress current is provided separately from the SMU 1 for the measurement and the switching therebetween is made through the stress/measurement change-over switch 12, and hence the change of the leakage current relative to the stress applied time is more accurately and easily obtainable as compared with the known apparatus when the stress voltage Vst and the measurement applying voltage Vm are different from each other.

According to the first aspect of this invention, the accumulating section 30 is provided to obtain the real stress applied time Tst and the measurement time Tm so that the real stress applied time Tst and the measurement time Tm are obtained separately from each other, whereby the time change of the leakage current relative to the stress applied time is more accurately obtainable as compared with the known apparatus. Accordingly, it is possible to provide a semiconductor electrical characteristic measuring apparatus ensuring the measurement with higher reliability.

In addition, according to the second aspect of this invention, the SSU 11 for applying the stress voltage or stress current is provided separately from the SMU 1 for the measurement and the switching therebetween is made through the stress/measurement change-over switch 12, and hence the change of the leakage current relative to the stress applied time is more accurately and easily obtainable as compared with the known apparatus, particularly when the stress voltage Vst and the measurement applying voltage Vm are different from each other. Accordingly, it is possible to provide a semiconductor electrical characteristic measuring apparatus ensuring the speedier measurement with higher reliability.

It should be understood that the foregoing relates to only preferred embodiments of the invention, and that it is intended to cover all changes and modifications of the embodiments of the invention herein used for the purpose of the disclosure, which do not constitute departures from the spirit and scope of the invention.

What is claimed is:

1. An apparatus for measuring an electrical characteristic of a semiconductor device comprising:

stress applying/measuring means for applying an electrical stress to a semiconductor device and for measuring a current flowing in the semiconductor device;

time measuring means for measuring separately, in a time interval including a first time period and a second time period after the first time period, the first time period representative of duration of application of a stress by said stress applying/measuring means, the first time period being designated stress applied time, and the second time period indicative of a measurement time for measuring the current flowing in the semiconductor device;

memory means for recording a measurement value representing the current measured by said stress applying/measuring means and for recording the stress applied time;

display means for displaying content of said memory means; and control means coupled to said memory means, said display means, said time measuring means, and said stress applying measuring means for controlling operation of said memory means, said display means, said time measuring means, and said stress applying/measuring means for measurement of an electrical characteristic of the semiconductor device.

2. The semiconductor electrical characteristic measuring apparatus according to claim 1, wherein said stress applying/measuring means has a first source measuring unit for measuring a current flowing in the semiconductor device.

3. The semiconductor electrical characteristic measuring apparatus according to claim 1, wherein said stress applying/measuring means includes:

a stress power unit for applying an electrical stress to the semiconductor device;

a source measuring unit for measuring one of current flowing in and voltage across the semiconductor device when one of a voltage and a current is applied to the semiconductor device; and a stress/measurement switch for selectively connecting one of said stress power unit and said source measuring unit to the semiconductor device.

4. The semiconductor electrical characteristic measuring apparatus according to claim 1, wherein said control means generates an internal clock and includes an accumulating section comprising at least one counter, said time measuring means counting the internal clock to measure the time interval.

5. The semiconductor electrical characteristic measuring apparatus according to claim 1, wherein said control means generates an internal clock, and said time measuring means includes a counter having a program for counting the internal clock.

6. The apparatus of claim 1 wherein said time measuring means comprises a counting circuit coupled to said control means and wherein said apparatus comprises a timer for controlling duration of the applied stress.

7. The semiconductor electrical characteristic measuring apparatus according to claim 1, wherein the semiconductor device includes a semiconductor element with a PN junction, and wherein said semiconductor electrical characteristic measuring apparatus comprises means for measuring a change of junction leakage current in the junction of the semiconductor element relative to the stress applied time.

8. The semiconductor electrical characteristic measuring apparatus according to claim 1, wherein the semiconductor device includes a semiconductor element with a dielectric film, and wherein said semiconductor electrical characteristic measuring apparatus comprises means for measuring a change of dielectric film leakage current in the dielectric film relative to the stress applied time.

* * * * *